United States Patent [19]

Batten, Jr. et al.

[11] Patent Number: 6,035,513

[45] Date of Patent: Mar. 14, 2000

[54] ASSEMBLIES OF ELECTRONIC DEVICES AND FLEXIBLE CONTAINERS THEREFOR

[75] Inventors: L. Eugene Batten, Jr., Angier; Patrick L. Downie, Apex; Dennis A. McCullock, Chapel Hill, all of N.C.

[73] Assignee: Nortel Networks Corporation, Montreal, Canada

[21] Appl. No.: 09/255,752

[22] Filed: Feb. 23, 1999

Related U.S. Application Data

[62] Division of application No. 09/083,155, May 22, 1998.

[51] Int. Cl.$^7$ ................................................ B23P 11/02
[52] U.S. Cl. .................... 29/450; 361/704; 361/714; 361/720; 257/718; 257/722; 206/706
[58] Field of Search ............................. 361/704, 714, 361/707, 709, 710, 712, 720, 722; 257/713, 717, 718, 722; 174/16.3; 165/80.3; 29/450, 451, 525.11; 206/706, 710

[56] References Cited

U.S. PATENT DOCUMENTS

| | | | |
|---|---|---|---|
| 3,543,841 | 12/1970 | Eastman | 165/80.3 |
| 3,756,399 | 9/1973 | Cosier et al. | 206/706 |
| 4,547,834 | 10/1985 | Dumont et al. | 361/704 |
| 4,587,595 | 5/1986 | Staples | 165/80.3 |
| 5,000,256 | 3/1991 | Tousignant | 361/699 |
| 5,339,215 | 8/1994 | Nishiguchi | 361/704 |
| 5,403,973 | 4/1995 | Santilli et al. | 361/704 |
| 5,436,803 | 7/1995 | Annis et al. | 361/818 |
| 5,455,457 | 10/1995 | Kurokawa | 257/713 |
| 5,508,885 | 4/1996 | Ishimoto | 361/704 |
| 5,545,494 | 8/1996 | Trumble et al. | 429/163 |
| 5,566,052 | 10/1996 | Hughes | 361/704 |
| 5,568,683 | 10/1996 | Chia et al. | 361/720 |
| 5,689,878 | 11/1997 | Dahringer et al. | 361/818 |
| 5,796,583 | 8/1998 | Gale et al. | 361/704 |
| 5,838,064 | 11/1998 | Shimada et al. | 257/718 |
| 5,880,524 | 3/1999 | Xie | 257/722 |
| 5,917,703 | 6/1999 | Murphy | 361/704 |
| 5,926,374 | 7/1999 | Onoda et al. | 206/706 |
| 5,940,272 | 8/1999 | Emori et al. | 361/704 |
| 5,945,736 | 8/1999 | Rife et al. | 257/718 |

*Primary Examiner*—David P. Bryant
*Attorney, Agent, or Firm*—Foley & Lardner

[57] ABSTRACT

For economic reasons, space saving and simplicity in design, an assembly is provided of an electronic device and a flexible container with the electronic device inside the container and having electrical conductors extending from the chamber for connection to electrical equipment outside the container. To prevent overheating, the assembly also includes a heat transfer device. This device has a first heat conductive element-inside the chamber, and thermally connected to the electronic device, and a second heat conductive element disposed outside the container. The two heat conductive elements are fastened together with the wall of the container clamped between them for conduction of heat to the second element. To avoid forming apertures in the wall for connection purposes, the second heat conductive element is formed with channels at its edges which receive edges of the first element and with the wall in between and lying within the channels.

4 Claims, 5 Drawing Sheets

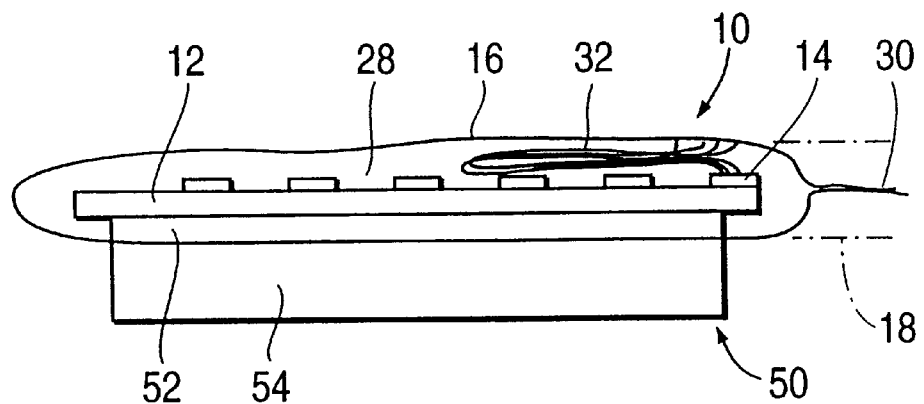
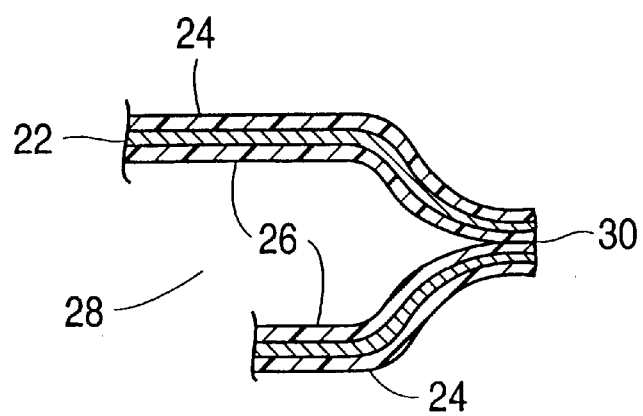
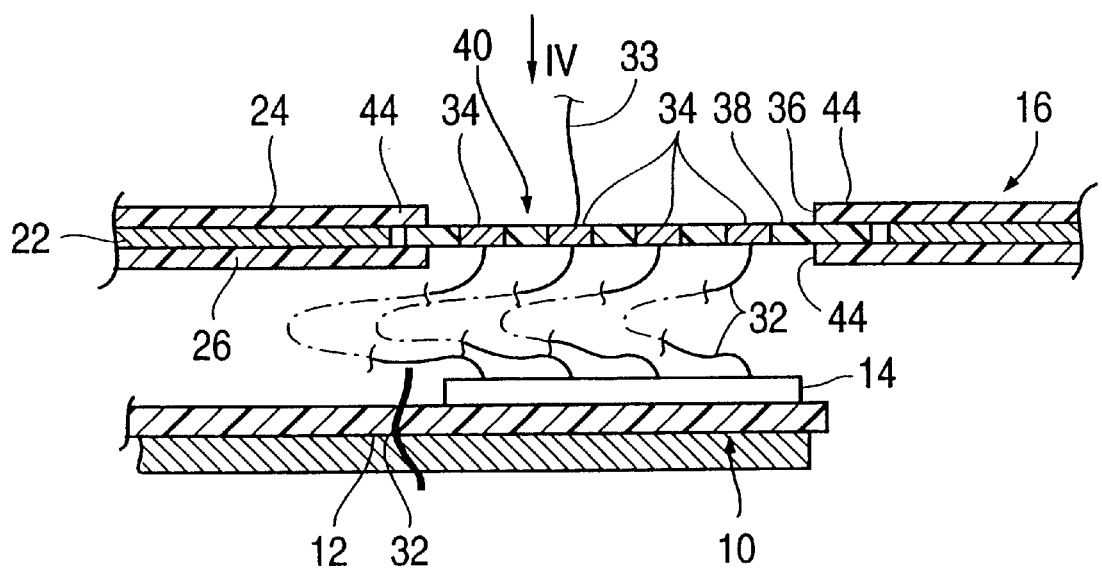

ASSEMBLIES OF ELECTRONIC DEVICES AND FLEXIBLE CONTAINERS THEREFOR

This application is a division of Ser. No. 09/083,155, filed May 22, 1998.

This invention relates to electronic devices within flexible containers.

In the electronics industry, electronic devices, e.g. printed circuit boards, are conventionally incorporated into equipment. Depending upon usage of printed circuit boards particularly, it may be required to prevent electromagnetic radiation from passing to or from electronic components mounted upon the boards because of the electromagnetic interference (EMI) which results. Up to the present time, it has been conventional practice to provide EMI shielding around an entire printed circuit board by housing the printed circuit board within a conductive rigid metal shield forming part of an assembly with the printed circuit board. The metal shield is grounded to provide the required EMI protection. An electrical connector is necessary to connect the printed circuit board with electrical equipment or a power source exteriorly of the shield. Conventional arrangements have proved to be unsatisfactorily expensive, occupy an inordinately large spacial volume as compared to the volume of the printed circuit board and its electronic components, and require many manufacturing steps.

In an effort to overcome the above problems, U.S. Pat. No. 5,545,494 to W. P. Trumble et al, describes an assembly of a printed circuit board and a flexible container around the board and in which EMI protection is provided by a conductive flexible metal layer as an inner layer of the container wall. The container has an opening within which a connector of the board is mounted with the opening to the container being sealed around a peripheral surface of the body of the connector. Not only is EMI protection provided, but also the inside of the container, and thus the printed circuit board and its electronic components are protected from dust and any other airborne contamination. The problem with the construction described in the above patent is that the connector body needs to be sufficiently large in size for the container to seal around it at the container opening. A body of this size is much larger than would otherwise be necessary merely to be mounted upon a printed circuit board for conveying signals to and from the board. The structure is therefore cumbersome.

Since the grant of the above Patent, Patent Applications have been filed relating to improvements of structures having flexible containers surrounding electronic devices. These applications, all filed on Dec. 12, 1997, to a common assignee also common with this present application, deal with certain specific developmental improvements as follows.

In patent application Ser. No. 08/989,719 there is described a flexible container and its method of manufacture in which the container has electrically conductive elements present in a wall region of the container, the conductive elements being electrically isolated from each other and from an EMI protection layer forming part of the wall of the container. Each of these electrically conductive elements is for connection at one end to an electrical conductor inside a chamber of the container and at the other end to an electrical conductor outside the chamber.

Patent application Ser. No. 08/989,813 deals with an assembly of a flexible container and an electrical device within the container wherein a grounding device has a ground element electrically connected to a ground conductor of the electronic device. The ground element is secured to a laminate construction wall of the container to form a capacitive coupling with an EMI protection layer forming part of the wall, the EMI protection layer and the ground element being maintained at a fixed distance apart.

Patent application Ser. No. 08/989,825 provides a ground for an electronic device forming part of an assembly with a flexible container by having a grounding device connecting a ground conductor of the electronic device in direct contact with an EMI protection layer which forms part of a laminate wall construction of the container. In this structure, the grounding device has a ground element provided with teeth, the ground element being clamped against the laminate construction wall with the teeth cutting into the wall and into electrically conductive contact with the EMI protection layer.

In patent application Ser. No. 08/989,812 there is described an assembly of flexible container and electronic device and its method of construction in which electrical conductors pass through a laminate construction wall of the container while being electrically isolated from an EMI protection layer of the wall. A ground conductor extends through the wall while being spaced from the EMI protection layer by a dielectric spacer so as to produce a desired capacitive effect to short certain electrical frequencies to ground.

Application Ser. No. 08/989,829 relates to a printed circuit board and a flexible container in which an electrical connector on the inside of the container is connected to an electrical connector on the outside of the container by connector pins which extend through the wall of the container while being electrically isolated from an EMI protection layer forming part of the wall.

It is envisaged that in use of certain, if not all, assemblies of flexible containers and electronic devices, heat may be generated by electronic components of the devices and this heat will be required to be transferred to the outside of the container to prevent build-up of heat and the resultant overheating of the electronic component or of other components and which could result in operational failure.

The present invention seeks to provide an assembly of flexible container and an electronic device which will overcome the heating problems in a practical manner.

Accordingly, the present invention provides an assembly of flexible container and electronic device in which the flexible container defines a sealed chamber and the electronic device is located within the chamber and has electrically conductive means extending out from the sealed chamber for connection to electrical means outside the container, the assembly also including a heat transfer device for transferring heat from the electronic device out from the assembly, the heat transfer device comprising a first and a second heat conductive elements, the first element being disposed within the chamber and thermally connected to the electronic device, and the second element disposed outside the container with a wall of the container clamped between the first and second elements so as to transfer heat by heat conduction through the wall from the first to the second heat conductive element.

In the assembly according to the invention, heat is thus transferred through a wall of the container as required without any aperture being required in the container wall to enable a heat transfer device to protrude through the wall from inside the container and into ambient atmosphere. The invention therefore avoids any sealing necessary around such an aperture, between the wall and a heat transfer device, together with manufacturing steps necessary to achieve such a structure and the possibility of seal failure either in a production line or during future use. It is envisaged that where the electronic device comprises a substrate, as in the case of a printed circuit board, a heat transfer device outside the scope of this invention could conceivably be large in comparison to the size of the container thereby requiring a relatively large size aperture through the container with possibly insurmountable sealing problems involved. With the inventive step however, with the container wall clamped between the two heat conductive elements, then the required heat conduction through the wall is achievable while avoiding the above problem.

In preferred arrangements, the first and second heat conductive elements comprise heat conductive plates. The first element has a planar plate surface which extends across a substantial area of a substrate of the electronic device so as to transfer heat directly from the substrate into the plate surface.

In order to prevent the need for securing means to extend through the container wall so as to urge the plate together to create the clamping effect, one of the plates, preferably that of the second heat conductive element has opposite edges formed with inwardly facing channels for receiving edges of the plate of the first element with the thickness of the container wall disposed between the elements.

The second heat conductive element may be caused to slide over the first element and on the outside of the container so as to slidably receive the edges of the first element into the inwardly facing channels. However, a more efficient clamping effect is obtained by forming the plate of the second element in two portions which are attached together by screw-threaded means. With each of these portions having one of the inwardly facing channels, then each portion may be applied laterally against a corresponding edge of the plate of the first element, with the container wall sandwiched between, the screw-threaded means then being tightened to draw the two portions towards each other. This action increases the engagement of the edges of the plate of the first element inside the channels thereby compressing the wall of the container in the thickness direction. As a result, intimate contact is created between the container wall and both plates to provide improved heat conductive capabilities.

Each inwardly facing channel and its associated edge of the plate of the first heat conductive element, during engagement, produces a wedge effect. Hence, when the two plate portions are screwed together, the wedging action urges the two plates towards each other. This applies a compressive force over substantially the whole of the container wall disposed between the two plates so that an overall intimate contact between the wall and each of the plates is obtained. Heat conductivity is thereby increased. In a further advantageous construction, the surface of the plate of the first element which contacts the container wall is convex and the mating surface of the other element is correspondingly concave. This tends to increase the wedging effect and further increases the heat conductivity from the first to the second heat conductive elements towards a maximum.

The invention also includes a method of assembling a flexible container and an electronic device comprising enclosing the electronic device within the container with the electronic device having a first heat conductive element in heat conductive engagement with the electronic device, and then clamping a wall of the container between the first heat conductive element and a second heat conductive element disposed on the outside of the container whereby heat is transferred from the first conductive element through the container wall and into the second heat conductive element.

One embodiment of the invention will now be described, by way of example, with reference to the accompanying drawings, in which:

FIG. 1 is a side elevational diagrammatic view in cross-section of an assembly of an electronic device comprising a printed circuit board disposed within a flexible container;

FIG. 2 is a cross-sectional view similar to FIG. 1, but on a larger scale, of part of the assembly;

FIG. 3 is a view similar to FIG. 2 of another part of the assembly;

Figure 4:
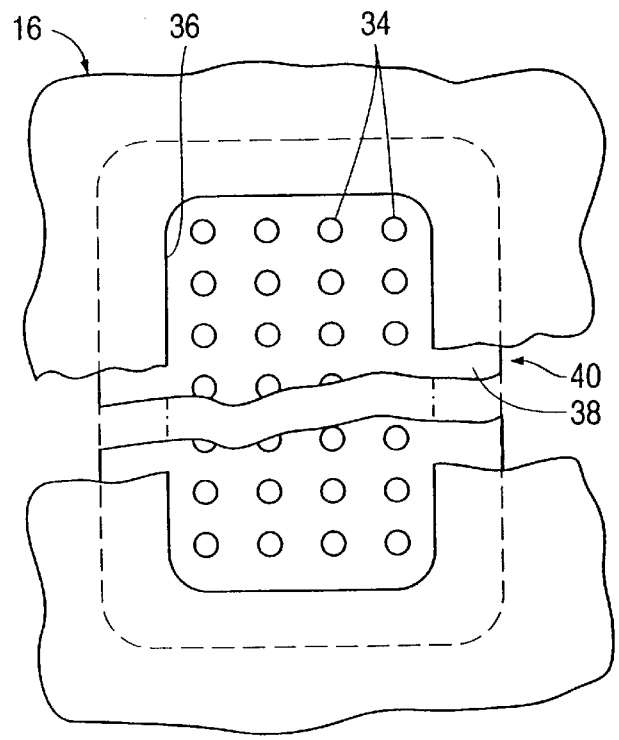
FIG. 4 is a view in the direction of arrow 1V in FIG. 3 of part of the assembly.

In the embodiment, as shown in FIG. 1, an assembly 10 of a printed circuit board and flexible container comprises a printed circuit board 12 of conventional construction and having a planar substrate, the printed circuit board having an elongate electrical connector 14 connected along one edge region of the substrate in conventional manner. A flexible container 16 of the assembly is of laminate construction wall and requires an EMI protection layer for the purpose of preventing or substantially diminishing the amount of magnetic radiation penetrating the container either to or from electronic components 20 mounted upon the printed circuit board.

For this, as shown in FIGS. 2 and 3, a thin metal layer 22 (e.g. copper or other suitable conductive material) is provided intermediate inner and outer layers of the container. The layer 22 may be of any desired thickness while being suitable for its desired purpose. It is found that a thickness down to 0.5 mil will suffice. The layer 22 is also imperforate and thus also serves as a moisture or other fluid barrier through the wall of the container. Alternatively, the layer 22 is perforate while still satisfying its EMI protection requirements and a specific moisture impermeable layer (not shown) is then included in the container. This specific layer may, for instance, be made from polyvinylidene chloride, such as sold under the trade name "Saran". An outer layer 24 is required to provide strength to the container and also to have abrasion and cutting resistance. In addition, it should also have dielectric properties. Any suitable polymeric material may do for this purpose, e.g. polyethyleneterephthalate, possible sold under the trade name "Mylar". Other materials are also suitable including polypropylene or polyamide. The outer layer is of a desired thickness to provide required flexibility. A thickness of at least 1 mil is found suitable.

An inner layer 26 which faces inwardly into a chamber 28 within the container needs also to be of dielectric material. This is basically to prevent shorting of circuitry on the printed circuit board should the container contact any surface of the board or contact any electrical conductor carried by the board. With the particular requirements of the container, it is also necessary for the material of the inner layer to be such that it will fuse and heat seal to itself. Suitable material, and as used in this embodiment, is polyethylene. As shown in FIGS. 1 and 2, marginal edge regions 30 of the container 16 at an open end 18 have been brought together with inside surfaces provided by the polyethylene inner layer 26 abutted and then heat sealed together- An airtight seal along the fused together marginal edge regions 30 is thus provided thereby air-tightly sealing the chamber 28 within the container from the outside environment.

The printed circuit board 12 communicates electrically with equipment exteriorly of the container 16 by means of a plurality of individually insulated signal conductors which extend from signal terminals of the connector 14. This electrical communication may be achieved in any desirable manner involving the conducting of signals through the wall structure of the container 16 while bypassing the EMI protection layer 22. Conveniently, the structure to achieve this purpose may be in a manner described, for instance, in patent application Ser. No. 08/989,812 or in patent application Ser. No. 08/989,719, the disclosures of which are imparted into this specification by reference. In particular, and according to one construction described in patent application Ser/ No. 08/989,719, in this present embodiment, wires 32 (see FIGS. 1 and 3) which extend from the signal and ground terminals of the connector 14 are soldered to electrically conductive elements 34 which are carried by the wall of the container as will now be described.

As already indicated, the wall of the container is a laminate construction wall comprising the three layers 22, 24 and 26. However, the laminate construction wall is also formed with an elongate aperture 36 (FIGS. 3 and 4) which preferably overlies the position of the connector 14. The aperture 36 is bridged and sealingly closed by a carrier 38 of a preformed assembly 40 of the carrier and the electrically conductive elements 34. The carrier 38 is a single layer of a dielectric material, e.g. polyethylene, polypropylene or polyamide, which may be bonded or heat-sealed to either or both of the inner or outer layers 24 and 26 of the laminate construction wall. The dielectric material of the carrier 38 holds the electrically conductive elements 34 spaced apart and electrically isolated from each other. Conveniently, these elements are relatively positioned in a pattern which corresponds to the pattern of the terminals in the connector 14 from which the conductor wires 32 extend. Thus, each of the elements 34 has an end facing inwardly into the container 16 and which is connected to a corresponding conductor wire 32, and an end which faces outwardly from the container and is exposed for soldering to another insulated conductor wire, e.g. as shown as item 33 in FIG. 3, and which extends to the other electrical equipment exteriorly of the container 16. The aperture 36, as shown in FIGS. 3 and 4, has marginal regions provided by aperture defining dielectric projections 44 of the layers 24 and 26 and which project outwardly beyond the EMI protection layer. The carrier 38 is inserted between the projections 44 and is bonded or heat-sealed thereto as required to seal across the aperture 36.

In addition, the embodiment includes a heat transfer device for transferring heat from the printed circuit board 12 to the outside of the container 16. This is necessary according to the present invention and thus in the embodiment, because certain of the electronic components mounted upon the printed circuit board generate heat in use which will be required to be removed so as to prevent heat build-up which could result in overheating of that or other electronic components present in the assembly thereby resulting in operational failure. As shown in FIGS. 1, 3, 5 and 6 the heat transfer device 50 comprises a first heat conductive element 52 and a second heat conductive element 54. The first heat conductive element 52 is assembled onto the side of the printed circuit board 12 opposite to that upon which the electronic components 20 are mounted. The first heat conductive element 52 is in the form of a plate having a planar surface 56 (see FIG. 6) which is mounted in heat conductive contact against the opposing surface of the printed circuit board 12 and extends substantially over the whole of that opposing surface of the board to create efficient heat conducting capabilities. As shown by FIG. 5a, the printed circuit board 12 includes a heat conductive and electrically conductive ground layer 58 for distributing heat across the board from undesirable hot spots which may be created in use. Heat is conducted to the ground layer 58 conveniently along copper filled bores 60 in the board, the copper in these bores possibly also acting as ground conductors from the electronic components 20. This heat which is at least partially distributed across the board by the layer 58 is then conducted to the heat conductive element 52 by means of a plurality of other copper filled bores 62 extending from the layer 58 to the surface of the board opposing the element 52.

Figure 5:
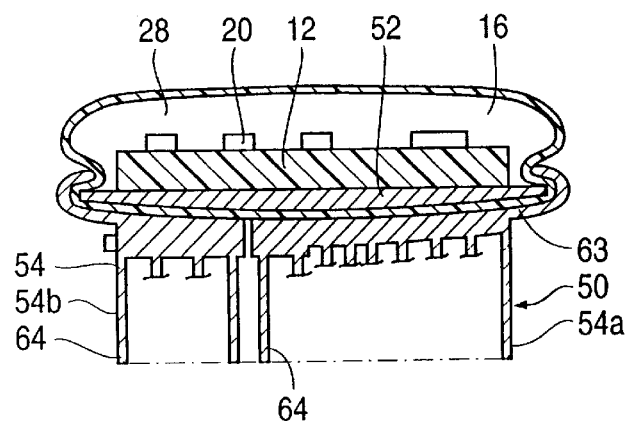
FIG. 5 is a cross-sectional view taken along line V—V in FIG. 1 and to a larger scale.
Figure 5A:
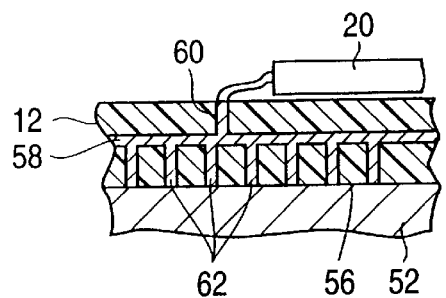
FIG. 5a is a cross-sectional view similar to FIG. 5 of part only of the assembly and to a larger scale.
Figure 6:
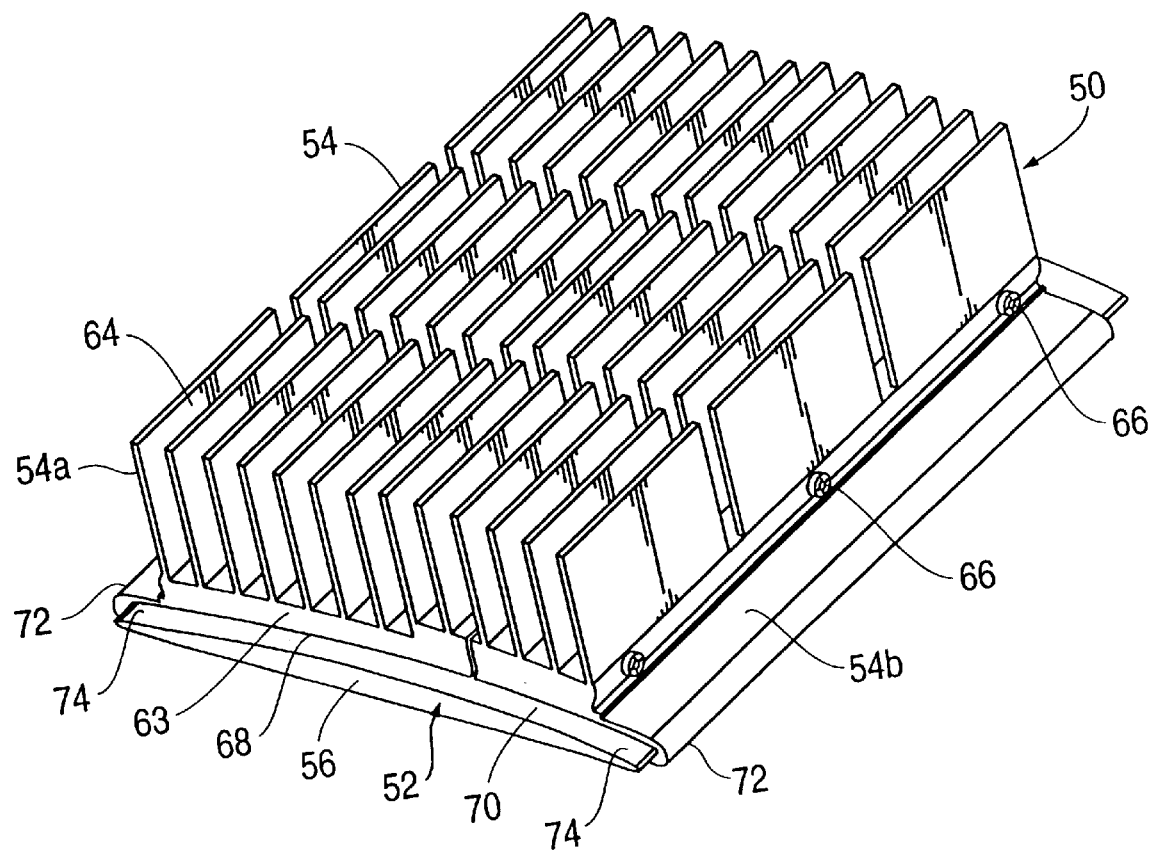
FIG. 6 is an isometric view of a heat transfer device of the embodiment and in a position inverted from that in previous figures.

As shown in FIGS. 5 and 6, the second heat conductive element 54 comprises a plate 63 with parallel outwardly extending fins 64 which, in the assembly, extend outwardly from the structure for transferring heat into an ambient cooling fluid such as air.

As shown in FIGS. 5 and 6, the heat conductive element 54 is formed of two portions, a large portion 54a and a smaller size portion 54b, which may be assembled together to form the element 54, by a plurality of screws 66. In the assembled condition of the element 54, a concave surface 68 is produced which is directed towards a substantially complementary convex surface 70 of the heat conductive element 52. In addition, the heat conductive element 54 comprises at opposite edges, inwardly facing channels 72 which thus face towards each other. These channels are provided, one in each of the portions 54a and 54b of the plate 54 with the concavity extending from channel to channel so that each portion 54a and 54b has part of the concave surface 68.

As will be seen from FIGS. 5 and 6, the design of the heat transfer device is such that with the element 56 engaging a wall of the container 16, then with opposite tapered edges 74 of the element 52 received within the channels 72, the assembly of the heat transfer device is complete with the wall of the container clamped between the elements 52 and 54. As will be discussed later, this clamping effect imposes a compressive force upon the sandwiched wall whereby the wall is held in intimate contact with both elements 52 and 54 so as to achieve optimum heat conductive capabilities through the wall. In FIG. 6, which is an assembly of the heat transfer device 50, the container wall is omitted for clarity.

Figure 7:
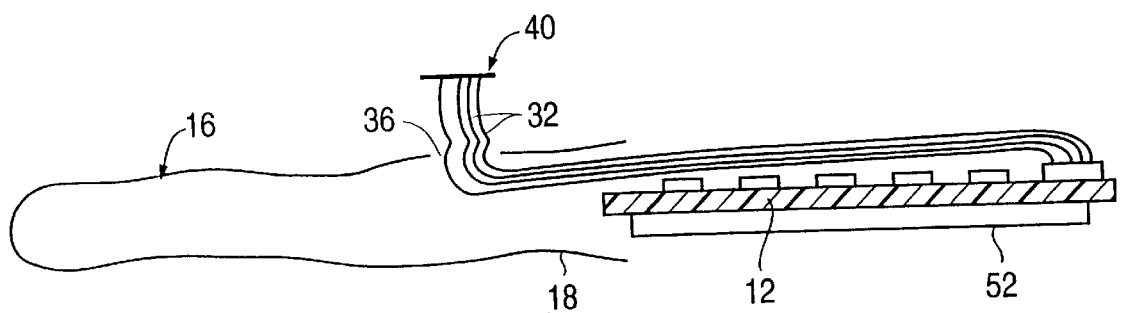
FIGS. 7, 8 and 9 are views similar to FIG. 1 and showing different stages in assembling the printed circuit board into the flexible container.
Figure 8:
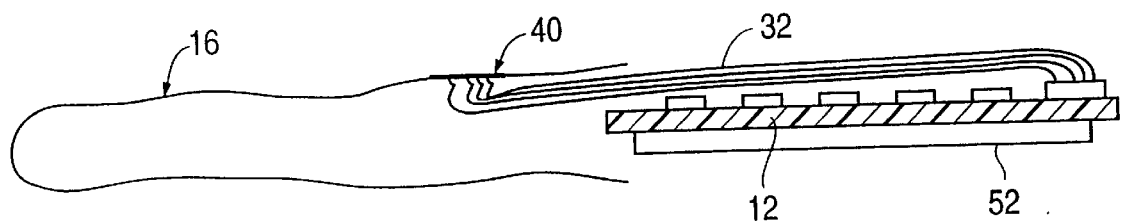

To form the total assembly, the printed circuit board 12 carrying the heat conductive element 52 is initially positioned outside the container 16 with the connector 14 mounted upon the board. The individually insulated conductor wires 32 are connected to terminals of the connector 14 and have their other ends pre-soldered to the electrically conductive elements 34 (see FIGS. 3 and 7) before the assembly of board and connector is mounted in position within the container. The method of assembly, which at this stage is as described for one particular structure in patent application Ser. No. 08/989,719, continues as follows. The assembly 40 is then inserted in position into the laminate construction wall as shown in FIGS. 3 and 8 and is sealed therein. With the printed circuit board inserted through the open end 18 and residing within the chamber 28 (FIG. 9), the open end 18 is sealed by a heat-sealing process to provide the closed end 30. The polyethylene layer 26 is easily heat-sealed to itself for this sealing step. As may be seen, at this stage in the assembly, the heat transfer device has not been assembled together. To achieve this final part of the assembly, it may be convenient to have the partially completed assembly of FIG. 9 inverted in position and into the position shown in FIGS. 10 and 11.

Figure 9:
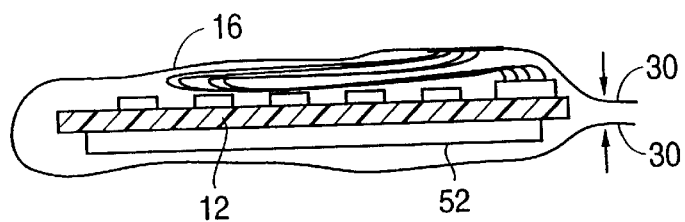
Figure 10:
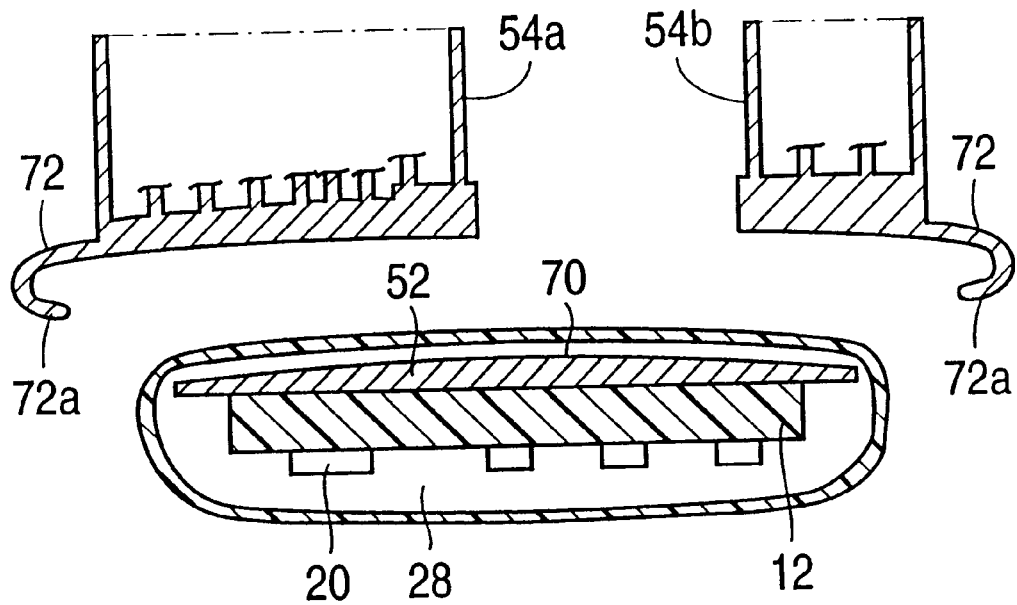
FIGS. 10 and 11, show two further stages in the assembly process with the structure again inverted, as in FIG. 6.

As shown by FIG. 10, which corresponds to FIG. 9, with the polyethylene layer 26 heat-sealed to provide the closed end 30, the heat conductive element 52 has its convex surface 70 facing towards a wall of the container 16. The heat transfer device 50 is then completed by assembling the heat conductive element 54 into position. This entails having the portions 54a and 54b of the element 54 separated as shown in FIG. 10 and then bringing these portions together while at the same time assembling them around the heat exchange element 52.

To assemble the portions 54a and 54b together, each portion is located so that an edge 74 of the element 70 is received into the associated channel 72 of the portion 54a or 54b and the two portions are moved towards each other for complete reception of the two edges into the channels. As may be seen from FIG. 11, to receive the tapered edges 74 into the channels 72, a free edge 72a of each channel needs to extend around the associated edge 74 thereby folding a part of the wall of the container around the tapered edge and also around the free edge 72a. The portions 54a and 54b of the element 54 are then drawn towards each other by the screws 66, the portions 54a and 54b being shown separated in FIG. 11. Tightening of the screws 66 not only draws the portions 54a and 54b together, but also causes the tapered edges 74 of the elements 70 to be drawn into the channels 72. The geometries of the tapered edges 74 and of the channels 72 are such that a wedging effect is created with the channels extending around tapered edges 74 so that the two plate portions 54a and 54b, in being drawn together, compress the wall of the container 16 through its thickness. This compression results in intimate surface engagement by the wall with each of the surfaces 68 and 70 of the elements 54 and 56. The concave and convex surfaces 68 and 70 increase the compressive effect during assembly. This is because the parts of the concave surface 68 of the portions 54a and 54b of the element 54 approach the convex surface 70 as they approach each other so as to compress the container wall.

Figure 11:
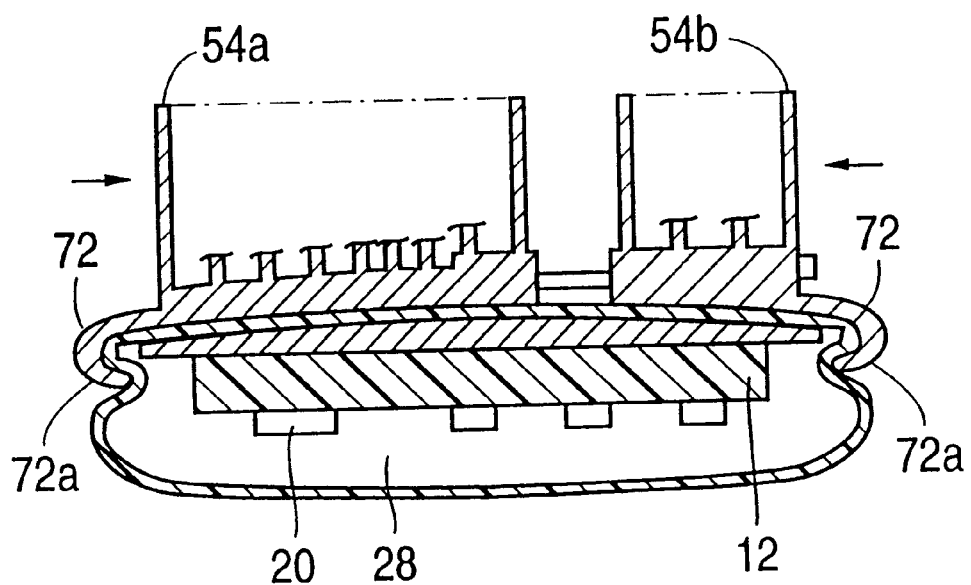

When the elements 54 and 56 have been drawn to their closest positions together by the screws 66, the assembly is then completed and is as shown in FIG. 5 which is, of course, in the inverted position from that shown in FIGS. 10 and 11.

With the heat transfer device constructed in the manner described in the embodiment, it has certain advantages. The use of the channels 72 for receiving the tapered edges 74 of the element 52 and convexly and concavely curved surfaces 70 and 68 respectively of the elements 52 and 54 ensure a wedging effect as discussed above, thereby compressing the wall of the container. The intimate contact thus created between the wall and each of the surfaces 68 and 70 maximizes the contact area for heat transfer, thereby maximizing the heat conductivity characteristics of the total assembly from the printed circuit board 12 and into the ambient atmosphere.

In addition, the design of the heat transfer device achieves the object of transferring heat from inside the container 16 to ambient atmosphere without the necessity of providing apertures through the container wall and which would need to be sealed around a heat transfer device of another construction not according to the invention. As may be seen from the above described embodiment, the heat conductive elements 52 and 54 are conveniently and simply assembled together on each side of the wall of the container by causing the container wall to fold around the tapered edges of the element 52 with the channels 72 providing the means for holding the heat transfer device in assembled condition. The arrangement thus ensures that the container is not unnecessarily apertured and with the closed end 30 operating effectively, then the printed circuit board 12 and its electronic components 20 are in a completely sealed chamber, even though efficient heat removal is guaranteed.

What is claimed is:

1. A method of assembling a flexible container and an electronic device comprising enclosing the electronic device within the container with the electronic device having a first heat conductive element in heat conductive engagement with the electronic device, and then clamping a wall of the container between the first heat conductive element and a second heat conductive element which is disposed on the outside of the container whereby heat is transferred from the first conductive element, through the container wall and into the second heat conductive element.

2. A method according to claim 1 wherein each of the first and second heat conductive elements comprises a plate, the plate of the second heat conductive element having opposite edges formed with inwardly facing channels, and, during clamping of the wall of the container between the first and second heat conductive elements, the method comprises progressively receiving opposite edges of the first heat conductive element within the channels with a wedging effect which compresses the container wall through its thickness and causes intimate heat conductive contact between the wall and each of the first and second heat conductive elements.

3. A method according to claim 2 wherein the second heat conductive element comprises two portions and, during the clamping of the container wall between the first and second heat conductive elements, the method comprises progressively drawing the two portions towards each other by operation of a screw-threaded means, thereby producing the wedging effect.

4. A method according to claim 3 wherein the surface of the plate of the first heat conductive element which contacts the wall of the container is convex between its edges, and the surface of the plate of the second heat conductive element which contacts the wall of the container is concave between its channels, the concavity being substantially complementary to the convexity, and each portion of the second heat conductive element is provided with a part of the concave surface, and during drawing of the portions towards each other the method comprises compressing the container wall between the concave and convex surfaces.

* * * * *